United States Patent [19]

Miljanic

[11] Patent Number: 4,884,038
[45] Date of Patent: Nov. 28, 1989

[54] TRANSCONDUCTANCE AMPLIFIER WITH TRANSFORMER COUPLED FORWARD FEED

[75] Inventor: Petar N. Miljanic, Gloucester, Canada

[73] Assignee: Canadian Patents and Development Limited-Societe Canadienne Des Brevets Et D'Exploitation Limitee, Ottawa, Canada

[21] Appl. No.: 173,630
[22] Filed: Mar. 25, 1988
[51] Int. Cl.⁴ .............................................. H03F 3/50
[52] U.S. Cl. ..................................... 330/165; 330/151
[58] Field of Search ............... 330/107, 149, 151, 165, 330/166, 167, 302; 323/355, 356, 357, 358

[56] References Cited

U.S. PATENT DOCUMENTS 3,497,793 2/1970 Gasparini et al. ................... 323/357
3,891,934 6/1975 Norton et al. .................. 330/165 X Primary Examiner—Steven Mottola

[57] ABSTRACT

A transconductance amplifier for emitting an output current that is a replica of a input voltage has its accuracy enhanced by a current comparator having a first magnetic core, a second magnetic core, a pair of ratio windings electromagnetically coupled with both the cores, and a detection winding electromagnetically coupled with the first core but not with the second core. A first of the ratio windings is connected in series with the output current of the transconductance amplifier. A high value resistor is connected in series with the second of the ratio windings across the input voltage of the transconductance amplifier whereby the current in the second ratio winding accurately reproduces the waveform of the input voltage. A further amplifier has its input connected to the detection winding. The output of this amplifier is so connected as to add a correcting current to the output current of the transconductance amplifier and thus provide the necessary accuracy enhancement.

11 Claims, 3 Drawing Sheets

TRANSCONDUCTANCE AMPLIFIER WITH TRANSFORMER COUPLED FORWARD FEED

FIELD OF THE INVENTION

The invention relates to a transconductance amplifier, or voltage-to-current converter, i.e. an amplifier that delivers an output current that faithfully reproduces an input voltage. In the case of an A.C. input voltage, the current output is a replica of the input waveform, as well as reproducing any changes in magnitude. In the case of a D.C. input voltage, the output current will faithfully follow the magnitude of the input voltage.

PRIOR ART

Transconductance amplifiers are known. The desired replica effect is traditionally achieved by means of a low resistance shunt in the output circuit, the voltage drop across this shunt being used to control a feedback loop to the input of the amplifier. Examples of circuits operating in accordance with this principle are illustrated as prior art circuits in FIGS. 1–4 of U.S. Pat. No. 4,451,779 issued May 29, 1984 to J. P. Griep.

However, especially when large currents are involved, there are difficulties in constructing a shunt that has sufficient magnitude stability and a sufficiently low phase angle error. It should be noted that, when such a transconductance amplifier is used for measurement purposes, e.g. the calibration of precision instruments such as ammeters, wattmeters and the like, an accuracy of only a few parts per million is desired. It is difficult to ensure the stability of the feedback loop to this high level of accuracy.

SUMMARY OF THE INVENTION

The object of the present invention is to overcome these difficulties and provide a transconductance amplifier with means for enhancing the accuracy of its current replica output.

The various features of the invention will be apparent from the following specific description of embodiments thereof, which are provided by way of example only.

DETAILED DESCRIPTION OF THE PREFERRED EMBODIMENTS

Figure 1:
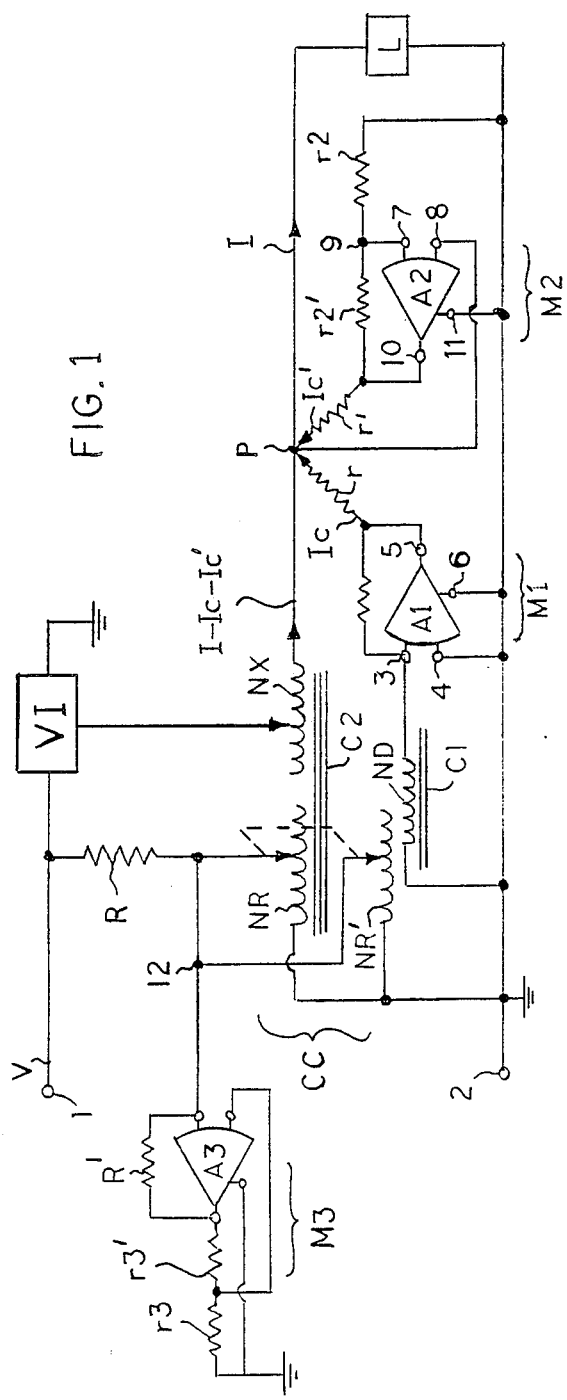
FIG. 1 shows a first circuit illustrating an embodiment of the invention for use with an A.C. input voltage.

FIG. 1 shows a standard transconductance amplifier VI that is assumed to contain a conventional, shunt-controlled, feedback loop (not shown), as explained above, but which nevertheless has an accuracy that is insufficient for the intended purpose.

The remainder of the circuit of FIG. 1 constitutes accuracy enhancement means provided to increase the accuracy to the required level. The A.C. input voltage V is applied to the amplifier VI from a terminal 1, and the replica output current I flows in a load L. Terminal 2 represents the grounded return.

Figure 3:
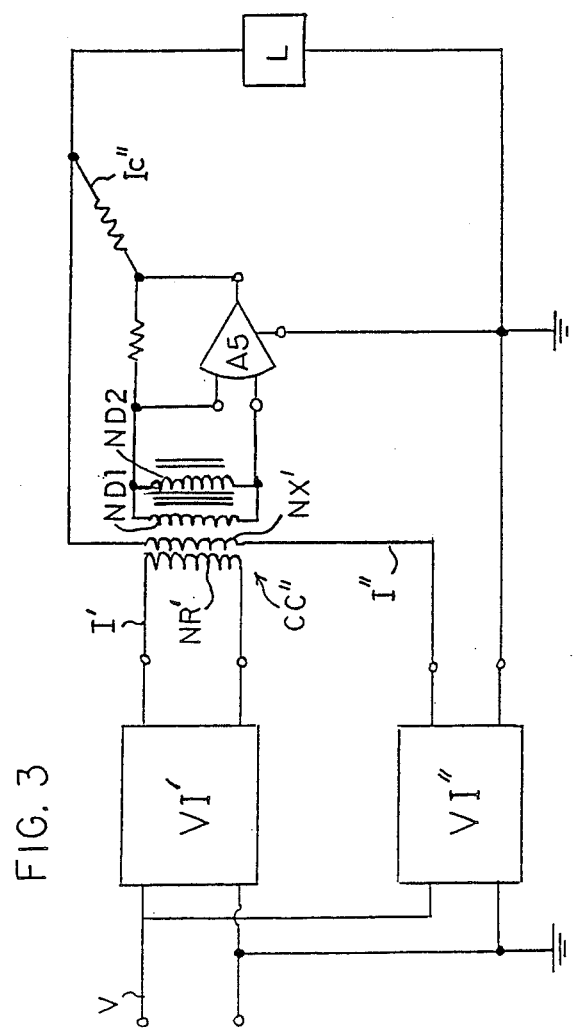
FIG. 3 shows a range extender circuit for use with FIG. 1.

A current comparator CC has two magnetic cores C1 and C2. While these cores can be located side-by-side, as shown in FIG. 3 of U.S. Pat. No. 3,534,247 issued Oct. 13, 1970 to P. N. Miljanic, it is preferred to employ a configuration in which the core C2 is a hollow toroid that encloses and shields the core C1, as shown in FIG. 4 of such prior patent. Such a device is described in more detail in U.S. Pat. No. 3,153,758 issued Oct. 20, 1964 to N. L. Kusters et al.

The outer core C2 couples electromagnetically with two windings that are outside it, namely ratio winding NR and NX, but does not couple electromagnetically with two windings, namely a compensation winding NR' and a detection winding ND, that are wound on the core C1 inside the core C2. The inner core C1 couples electromagnetically with all the windings. The ratio winding NR is connected across the input voltage V in series with a high resistance value, highly accurate resistor R. The compensation winding NR' is connected in parallel with the ratio winding NR and is ganged to it (broken lines). The current that flows in the compensation winding NR' will typically be two or three orders of magnitude smaller than the current that flows in the ratio winding. The function of the compensation winding NR' is to reduce the influence of the impedance of the winding NR.

The detection winding ND senses any ampere turn imbalance in the ratio and compensation windings NR, NR', NX due to a discrepancy between the waveform of the input voltage and the waveform of the current that flows in the ratio winding NX. The winding ND is connected across input terminals 3, 4 of an amplifier A1, the output 5, 6 of which provides a voltage proportional to the error current in the detection winding ND. This voltage together with a resistor r then provides a correction current Ic that is injected into the load current at point P. The amplifier A1 and its associate circuitry thus constitute a first current source that is referred to as a first correction circuit M1.

A second amplifier A2 of a second current source or correction circuit M2 adds additional current at point P to compensate for the fact that point P may not be exactly at ground potential. More specifically, input terminals 7, 8 of the amplifier A2 are connected between the point P and a center point 9 of a pair of series-connected resistors r2' and r2 whose resistance values bear a predetermined ratio n to each other, such series connection of resistors being connected in a circuit extending from the point P to ground. This second correction circuit M2 serves to generate a voltage $(n+1)VP$ across the output terminals 10, 11 of the amplifier A2, where VP is the voltage at point P. This voltage $(n+1)VP$ injects a further correction current Ic' at point P through a resistor r', where the resistance values $r'/r = r2'/r2 = n$. Hence the relatively innacurate current replica flowing out of the transconductance amplifier VI is corrected by the correction currents Ic and Ic' to provide a highly accurate current I through the load L.

Depending upon the level of accuracy demanded, the correction circuit M2 can be omitted.

On the other hand, if the reduction of the influence of the impedance of the ratio winding NR afforded by the compensation winding NR' is found insufficient, a still further correction circuit M3 can be used. This circuit will employ an amplifier A3 that is connected in a circuit that functions similarly to the correction circuit M2, and is connected to the junction point 12 between the resistor R and the windings NR and NR'. Here the resistance values will be r3'/r3=R'/R.

It should be noted that the arrangement is not restricted to sinusoidal waveforms, but can be used with distorted waveforms as well.

Figure 2:
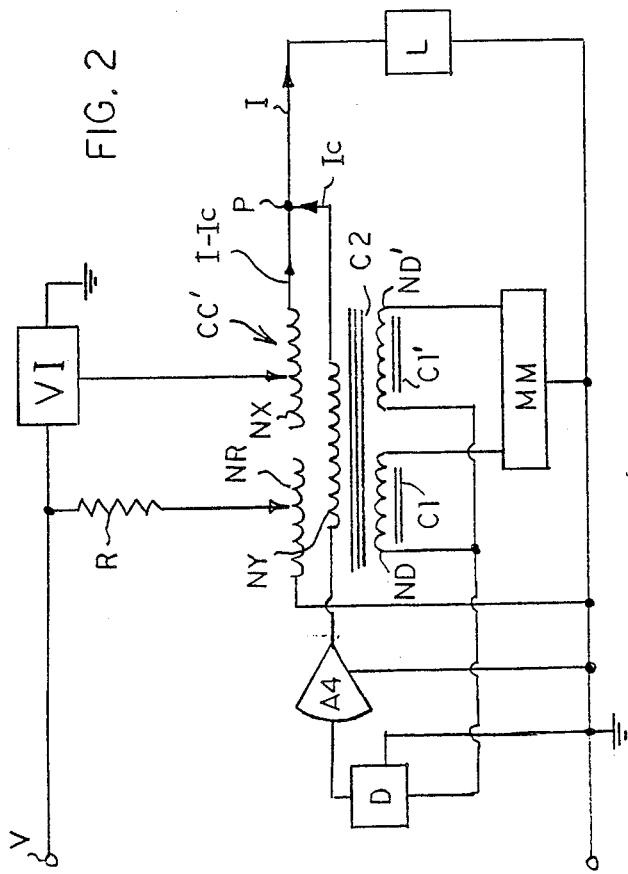
FIG. 2 shows a second circuit illustrating an embodiment of the invention for use with a D.C. input voltage.

FIG. 2 shows an arrangement designed to function with a D.C. input voltage V. The ratio winding NR now forms part of a D.C. current comparator CC' that has an outer core C2 and two inner cores C1 and C1'. These inner cores are a pair of side-by-side cores, each toroidal and each formed of high-permeability magnetic material. The second ratio winding NX remains in the current output, and there is now a pair of detection windings ND and ND', each wound on a respective one of the cores C1 and C1'. The windings ND and ND' are energised by a modulator MM and are connected in parallel to a demodulator D. This arrangement constitutes an ampere turn detector, and provides the input to an amplifier A4. A deviation or "balancing" winding NY is connected between the output of the amplifier A4 and the point P and provide a correction current Ic.

The theory of operation of such a direct current comparator is explained in a paper of N. L. Kusters et al entitled "A Current Comparator for the Precision Measurement of D-C Ratios" published in Communication and Electronics, January 1964, and in a paper of M. P. MacMartin et al entitled "A Self-Balancing Direct Current Comparator for 20 000 Amperes" published in IEEE Transactions on Magnetics, December 1965, pages 396 to 402.

The transconductance S (in Siemens) of a transconductance amplifier is expressed as the amperes out divided by the volts in. Hence, if in FIG. 1 V equals 5 volts for example, and I equals 5 amps, the transconductance would be unity. In the arrangement of FIG. 1, it is impractical to achieve a transconductance of more than about unity, because to do so would require a value of R that is too low for accuracy, and would also require too large a number of turns on the winding NR. However, there are some practical applications in which a substantially higher transconductance is required, for example, an output of say 100 amps for an input of 5 volts.

FIG. 3 demonstrates how this result can be achieved without sacrifice of accuracy. In this figure, VI' is assumed to be the circuit of FIG. 1, i.e. an accurate transconductance amplifier according to the present invention with a transconductance of, say, unity, the output I' of this amplifier VI' flowing in a winding NR' of a current comparator CC'' generally similar to the comparator CC. Reference numeral VI'' represents a conventional transconductance amplifier, i.e. one without the benefit of the improved accuracy of the present invention, but one that can achieve a much higher transconductance, e.g. 20 Siemens. Hence, if V equals 5 volts, I' could be 5 amps and I'' could be 100 amps. The output I'' flows in a winding NX' of the comparator CC''. The ampere turns imbalance is detected in parallel connected detection windings ND1 and ND2 which act with an amplifier A5 as in FIG. 1 to inject a correction current Ic'' into the load current, the winding ND1 coupling with both the cores of the comparator and the winding ND2 coupling with only the inner core.

If the system is a D.C. one, i.e. if VI' is the circuit of FIG. 2, the same result can be achieved by using a D.C. comparator such as the comparator CC' instead of the comparator CC''.

All the amplifiers in FIGS. 1 to 3 will be furnished with separate power supplies (not shown).

I claim:

1. The combination of a transconductance amplifier for emitting an output current to a load that is a replica of an input voltage, and means for enhancing the accuracy of such replica, said enhancing means comprising:
   (a) a current comparator comprising
      (i) first magnetic core means,
      (ii) second magnetic core means,
      (iii) a pair of ratio windings electro-magnetically coupled with both said core means, and
      (iv) detection winding means electro-magnetically coupled with the first core means but not with the second core means,
   (b) means connecting a first of said ratio windings in series with the output current of the transconductance amplifier,
   (c) a resistor connected to the second of said ratio windings to form a first series circuit,
   (d) means connecting such first series circuit across the input voltage of the transconductance amplifier whereby the current in said second ratio winding accurately reproduces the waveform of said input voltage, and
   (e) a current source for injecting into the output current of the transconductance amplifier a current proportional to an error current in the detection winding means.

2. The combination of claim 1, wherein said current source comprises
   (f) amplifying means having an input and an output,
   (g) means connecting the input of the amplifier means to the detection winding means, and
   (h) means connecting the output of the amplifier means to add a correcting current to the output current of the transconductance amplifier.

3. The combination of claim 2, wherein the input voltage is an A.C. voltage and the output current of the transconductance amplifier is an A.C. current that is a replica of the waveform of the A.C. input voltage, wherein the means (h) connecting the output of the amplifier means to the load includes a further resistor.

4. The combination of claim 2, wherein the input voltage is a D.C. voltage and the output current of the transconductance amplifier is a D.C. current that reproduces the magnitude of the D.C. input voltage, wherein the means (h) connecting the output of the amplifier means to the load comprise a deviation winding electromagnetically coupled with both the core means.

5. The combination of claim 4, wherein said first core means comprises a pair of first cores, and the detection winding means comprises a pair of detection windings electromagnetically coupled each with a respective one of said first cores, the means (g) connecting the input of the amplifier means to the detection winding means comprising an ampere turn detection circuit.

6. The combination of a transconductance amplifier for emitting an A.C. output current to a load that is a replica of the waveform of an A.C. input voltage, and means for enhancing the accuracy of such replica, said means comprising:
   (a) a current comparator comprising
      (i) a first magnetic core,
      (ii) a second magnetic core,
      (iii) a pair of ratio windings electro-magnetically coupled with both said cores, (iv) a detection winding electromagnetically coupled with the first core but not with the second core,
(b) means connecting a first of said ratio windings in series with the output current of the transconductance amplifier,
(c) a resistor connected to the second of said ratio windings to form a first series circuit,
(d) means connecting such first series circuit across the input voltage of the transconductance amplifier whereby the current in said second ratio winding accurately reproduces the waveform of said input voltage, and
(e) a current source for injecting into the output current of the transconductance amplifier a current proportional to an error current in the detection winding.

7. The combination of claim 6, wherein said current source comprises
(f) a second amplifier having an input and an output,
(g) means connecting the input of the second amplifier to the detection winding, and
(h) means connecting the output of the second amplifier to add a correction current to the output current of the transconductance amplifier.

8. The combination of claim 7, including
(i) a third amplifier having an input and an output,
(j) a pair of series-connected resistors forming a second series circuit connected across the load,
(k) means connecting the input of the third amplifier to a junction point between said pair of resistors, and
(l) means connecting the output of the third amplifier to add a further correction current to the output current of the transconductance amplifier.

9. The combination of claim 6, including
(f) a compensating winding electromagnetically coupled with the first core but not with the second core,
(g) means connecting the compensating winding in parallel with said second ratio winding to compensate for the impedance of said second ratio winding.

10. The combination of claim 9, including
(h) a second amplifier having an input and an output;
(i) a pair of series-connected resistors forming a second series circuit,
(j) means connecting the input of the fourth amplifier between a junction point between said further pair of resistors and a junction point in said first series circuit between the first resistor and the second ratio winding, and
(k) means connecting the output of the fourth amplifier across said fourth series circuit.

11. The combination of claim 1, further combined with
(f) a second transconductance amplifier having a higher transconductance than the accuracy-enhanced transconductance amplifier,
(g) a further current comparator comprising
(i) first magnetic core means,
(ii) second magnetic core means,
(iii) a pair of ratio windings electro-magnetically coupled with both said core means,
(iv) first detection winding means electro-magnetically coupled with both said core means, and
(v) second detection winding means electro-magnetically coupled with the first core means but not with the second core means and connected in parallel with the first detection winding means,
(h) means connecting a first of said ratio windings of the further current comparator in series with the output current of the accuracy-enhanced transconductance amplifier,
(i) means connecting a second of said ratio windings of the further current comparator in series with the output current of the second transconductance amplifier, and
(j) a current source for injecting into the output current of the second transconductance amplifier a current proportional to error currents in the detection winding means of the further current comparator.

* * * * *